United States Patent [19]

Yajima

[11] Patent Number: 5,346,841
[45] Date of Patent: Sep. 13, 1994

[54] METHOD OF MANUFACTURING SEMICONDUCTOR DEVICE USING ION IMPLANTATION

[75] Inventor: Kotaro Yajima, Hyogo, Japan

[73] Assignee: Mitsubishi Denki Kabushiki Kaisha, Tokyo, Japan

[21] Appl. No.: 86,741

[22] Filed: Jul. 6, 1993

Related U.S. Application Data

[63] Continuation of Ser. No. 744,107, Aug. 13, 1991, abandoned.

[30] Foreign Application Priority Data

Aug. 21, 1990 [JP] Japan .................. 2-222053

[51] Int. Cl.⁵ ..................... H01L 21/265
[52] U.S. Cl. ..................... 437/35; 437/29; 437/62
[58] Field of Search ..................... 437/35

[56] References Cited

U.S. PATENT DOCUMENTS

| | | | |
|---|---|---|---|
| 4,437,225 | 3/1984 | Mizutani | 437/21 |
| 4,676,841 | 6/1987 | Celler | 437/25 |
| 4,725,561 | 2/1988 | Haond et al. | 437/62 |
| 4,810,664 | 3/1989 | Kamins et al. | 437/26 |
| 4,835,113 | 5/1989 | Celler et al. | 437/62 |
| 4,921,812 | 5/1990 | Nagai et al. | 437/35 |

FOREIGN PATENT DOCUMENTS

| | | | |
|---|---|---|---|
| 58-19766 | 12/1983 | Japan | 437/27 |
| 61-185950 | 8/1986 | Japan . | |
| 63-283127 | 11/1988 | Japan | 437/35 |
| 6421919 | 1/1989 | Japan | 437/35 |
| 64-37835 | 2/1989 | Japan . | |

Primary Examiner—Olik Chaudhuri
Assistant Examiner—H. Jey Tsai
Attorney, Agent, or Firm—Lowe, Price, LeBlanc & Becker

[57] ABSTRACT

In a method of manufacturing a semiconductor device, after forming a mask for blocking ion implantation in a predetermined position on the main surface of a silicon substrate, oxygen ions are implanted from the direction making an angle of about 45° with respect to the main surface while intermittently changing the implantation energy and the dose in a suitable manner. This process of oxygen ion implantation is carried out with the silicon substrate being rotated in a plane parallel to the surface. According to the process above, an element isolation film is formed surrounding a portion below an active region in the silicon substrate only by the process of oxygen ion implantation and a heat treatment process after that. As a result, the productivity is increased compared with in the conventional method in which an element isolation film on the side portion of the active region is formed by thermal oxidation, and degradation of the properties of crystal and residual ions in the active regions are also prevented.

3 Claims, 10 Drawing Sheets

METHOD OF MANUFACTURING SEMICONDUCTOR DEVICE USING ION IMPLANTATION

This application is a continuation of application Ser. No. 07/744,107, filed Aug. 13, 1991, now abandoned.

BACKGROUND OF THE INVENTION

1. Field of the Invention

The invention relates generally to a method of manufacturing semiconductor devices and, more particularly, relates to a technique in which an element isolation layer is formed in a semiconductor substrate by ion implantation.

2. Description of the Background Art

Performance of semiconductor devices has been remarkably improved in recent years and rapid progress is being made in increasing integration density and the operation speed and decreasing power consumption. With increased integration density, a junction capacitance attendant on a pn junction for element isolation becomes a parasitic capacitance and causes disadvantageous decrease in the operation of circuit elements. In order to form a faster semiconductor device with reduced power consumption, it is an important subject to reduce this parasitic capacitance.

For example, some parasitic capacitances are generated between a collector and a substrate in a bipolar device while others are generated between source-/drain and a substrate in a MOS (Metal Oxide Semiconductor) device.

A conventional method for reducing the parasitic capacitance is that a silicon substrate is provided with a region where oxygen ions of a high concentration are to be implanted, and a surface silicon layer and substrate silicon are separated from each other using a buried oxide film formed by high temperature anneal as an insulating layer. This method is normally called "SIMOX (Separation by Implanted Oxygen)".

Figure 1A:
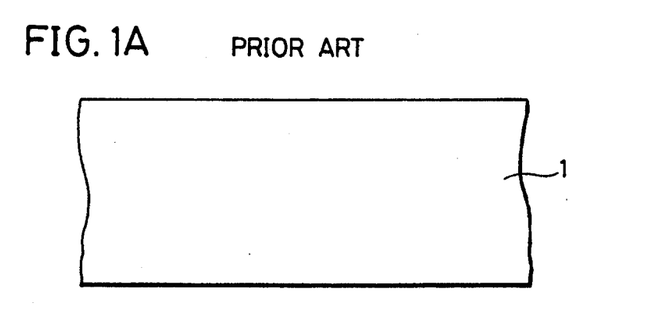
FIGS. 1A, 1B, 1C, 1D, 1E, 1F, and 1G are cross-sectional views sequentially showing a process of forming an element isolation structure by a conventional SIMOX method.
Figure 1B:
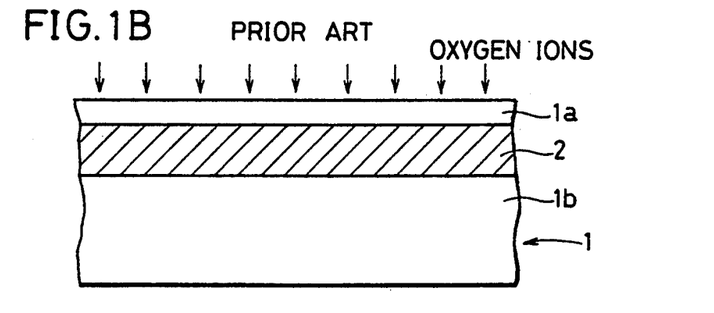

A description will now be made of one example of a manufacturing process of a semiconductor device to which the conventional SIMOX method above is applied, with reference to FIGS. 1A to 1G. Firstly, oxygen ions are implanted on the entire main surface of a semiconductor substrate 1 formed of silicon single crystal or the like shown in FIG. 1A with implantation energy of 180 to 200 KeV and the dose of 1.8 to $2.0 \times 10^{18}/cm^2$ as shown in FIG. 1B, so that an oxide silicon layer 2 is formed in a predetermined depth within the semiconductor substrate 1. The semiconductor substrate 1 is separated into an upper silicon layer 1a and a lower silicon layer 1b by this oxide silicon layer 2.

Figure 1C:
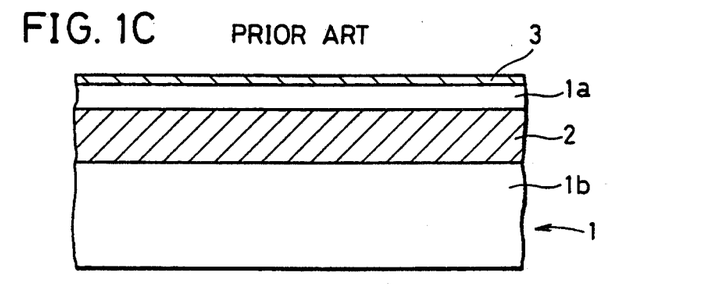
Figure 1D:
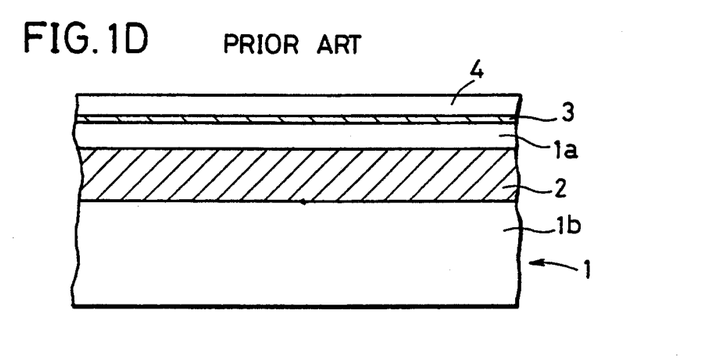

Referring now to FIG. 1C, a silicon oxide film is formed over the entire main surface of the semiconductor substrate 1 with a thermal oxidation method or a CVD method. Thereafter, furthermore, referring to FIG. 1D, a silicon nitride film 4 is formed over the entire surface of the silicon oxide film 3 by the CVD method.

Figure 1E:
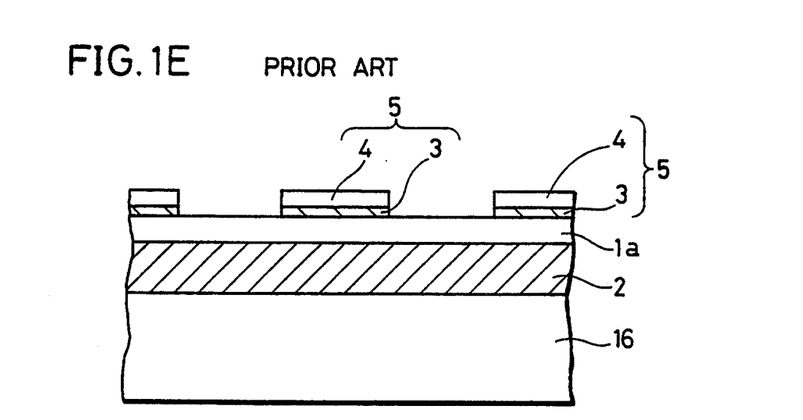

Then, the silicon nitride film 4 is selectively removed to be patterned by a photolithography technique. After that, a mask 5 shown in FIG. 1E is patterned by selectively removing the exposed silicon oxide film 3 by a dry etching method such as reactive ion etching, using the patterned silicon nitride film 4 as a mask.

Figure 1F:
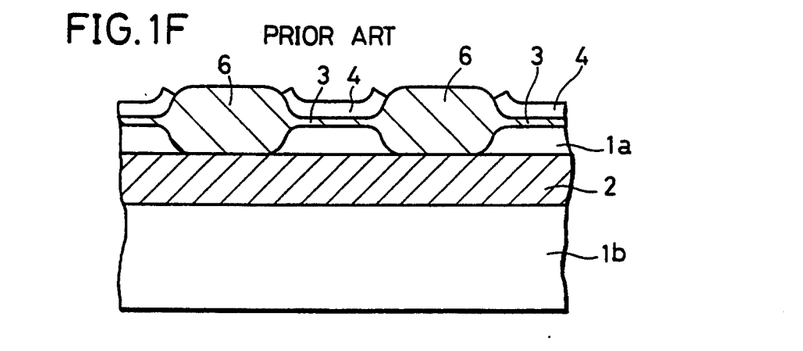

Then, by oxidizing the semiconductor substrate 1 in an atmosphere of high temperature oxidation, the exposed portion of the upper silicon layer 1a of the semiconductor substrate 1 is oxidized and a thick silicon oxide film 6 is formed. The silicon oxide film 6 is oxidized until it is in contact with the oxide silicon layer 2, as shown in FIG. 1F.

Figure 1G:
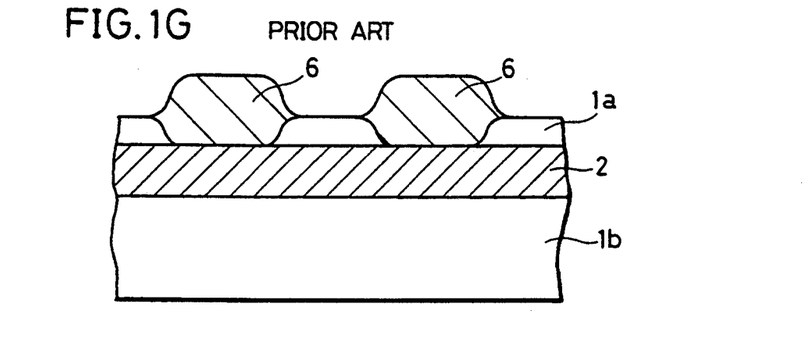

Subsequently, after removing, with phosphoric acid or the like, the silicon nitride film 4 used as a mask in the oxidation process for forming the silicon oxide film 6, the semiconductor substrate 1 is treated in an acid solution to remove the silicon oxide film 3, so that the upper silicon layer 1a except the region where the silicon oxide film 6 is formed is exposed (FIG. 1G).

As stated above, in accordance with this conventional method, the upper silicon layer 1a which is an active region is surrounded by the silicon oxide film 6 and the oxide silicon layer 2, so that a so-called electrically isolated complete element isolation structure can be obtained.

According to the conventional method above, however, a defect of the crystal is caused in the upper silicon layer 1a to be an active region and the element characteristics become deteriorated since the oxide silicon layer 2 is formed by implanting oxygen ions from the entire main surface of the semiconductor substrate 1.

A manufacturing method for solving the problem of the conventional method above is described in Japanese Patent Laying-Open (KOKAI) No. 61-185950. A description of the manufacturing process described herein will be made with reference to FIGS. 2A to 2E.

Figure 2A:
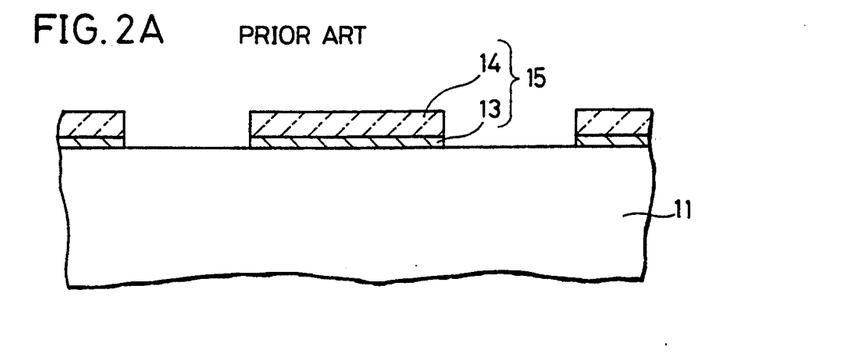
FIGS. 2A, 2B, 2C, 2D, and 2E are cross-sectional views sequentially showing a method of manufacturing a conventional semiconductor device in each step, for solving problems of the conventional method shown in FIGS. 1A to 1G.
Figure 2B:
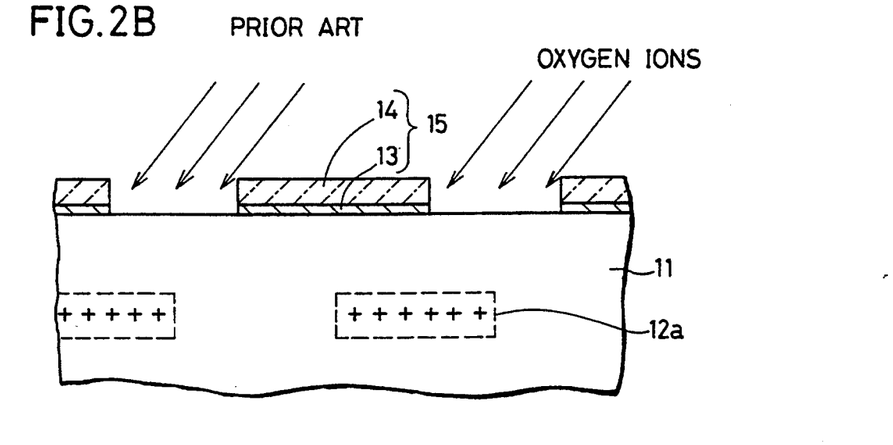
Figure 2C:
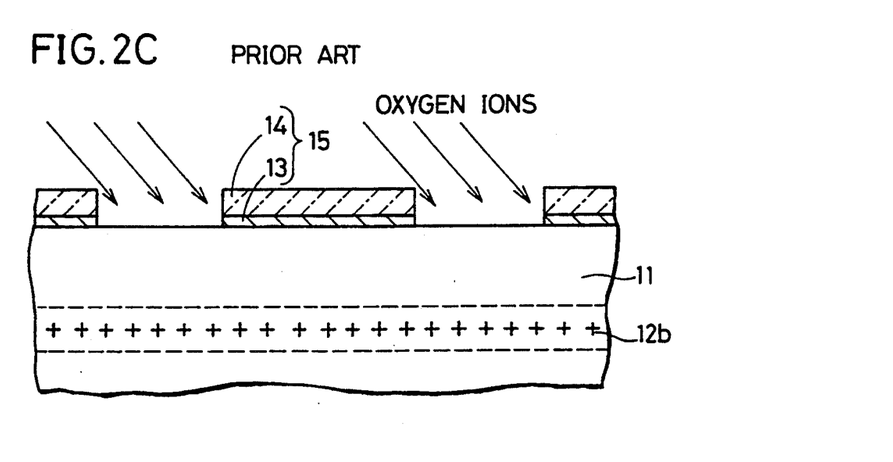
Figure 2D:
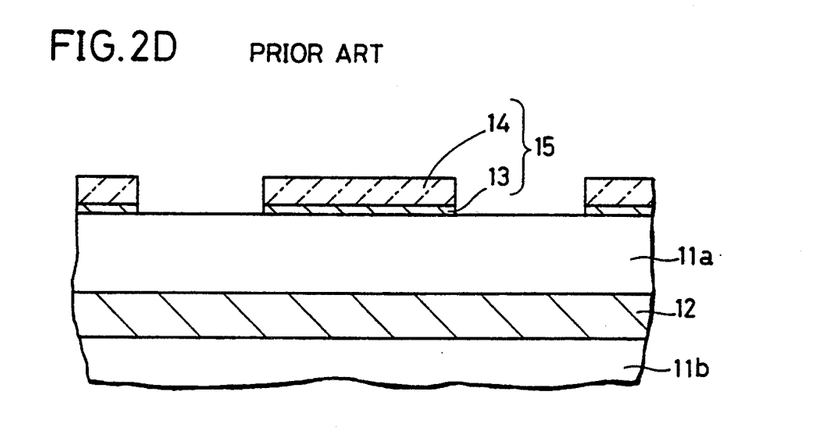

In the process of manufacturing a semiconductor element described herein, firstly, as shown in FIG. 2A, a mask 15 of a predetermined pattern including a silicon oxide film 13 and a silicon nitride film 14 is formed in the same way as of the mask 5 shown in FIG. 1E. Subsequently, referring to FIG. 2B, oxygen ions are implanted over the entire main surface of a semiconductor substrate 11 with a predetermined ion implantation energy and dose and at a predetermined angle of inclination, so that an ion implantation layer 12a is formed to be discontinuous in a predetermined position of a predetermined depth within the semiconductor substrate 11. Furthermore, referring to FIG. 2C, oxygen ions are implanted over the main surface of the semiconductor substrate 11 at an angle symmetrical to that in the case of FIG. 2B and with the same ion implantation energy and dose to form a continuous ion implantation layer 12b. After that, a heat treatment at 1100° C. or above is carried out to form a buried insulating layer 12 formed of oxide silicon, so that the semiconductor substrate 11 is separated into an upper silicon layer 11a and a lower silicon layer 11b (FIG. 2D).

Figure 2E:
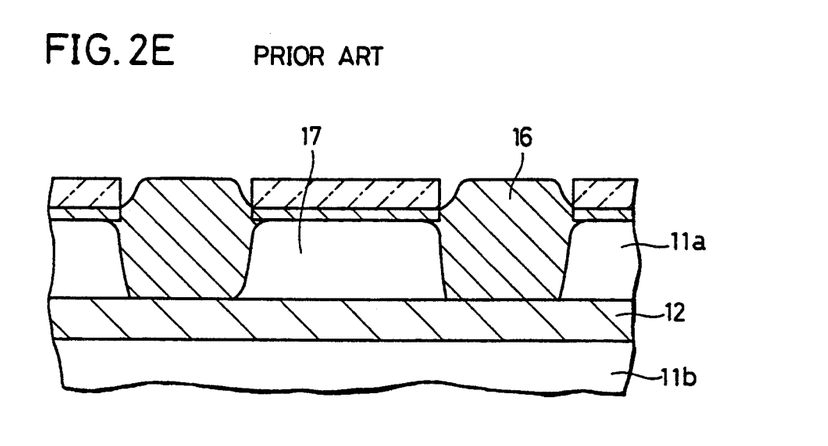

Referring to FIG. 2E, a silicon oxide film 16 is formed and an active region 17 in the upper silicon layer 11a is completely electrically isolated by selectively oxidizing the upper silicon layer 11a in an atmosphere of oxidation.

In the manufacturing process, the oxygen ions are not directly implanted into the upper silicon layer 11a of the active region, so that degradation of the properties of crystal in the portion is prevented.

The method disclosed in the publication above can prevent degradation of the properties of crystal of the semiconductor substrate 11 to be the active region 17 immediately below the mask and prevent the residual oxygen ions; however, it requires an additional process of selective oxidation for further forming the silicon oxide film 16 on the side surface after forming the buried insulating layer 12, resulting in increase of the number of manufacturing processes and reduction of the productivity.

SUMMARY OF THE INVENTION

An object of the present invention is to provide a method of manufacturing a semiconductor device in which an element isolation layer can be formed for electrically isolating an active region only by a process of forming a buried insulating layer in the semiconductor substrate.

A method of manufacturing a semiconductor device according to the present invention includes the steps of forming a mask for blocking ion implantation in a predetermined position on the main surface of the semiconductor substrate, and carrying out irradiation with ions which react with the semiconductor substrate to form an insulator layer, from an oblique direction making a predetermined angle with the main surface of the semiconductor substrate, while changing at least the ion implantation energy. In the process of irradiation with the ions, the semiconductor substrate is continuously or intermittently rotated relatively with respect to the direction of ion irradiation in a plane parallel to the surface thereof.

With the process above according to the present invention, an element isolation film is formed surrounding a portion below an active region of the semiconductor substrate only by a process of implanting ions which react with the semiconductor substrate to form an insulator.

In the ion implantation process according to the present invention, it is desirable that both of ion implantation energy and dose are changed intermittently. This is done for solving a problem caused by a change of the extent of distribution of the ions with the depth of ion implantation when only the ion implantation energy is changed with the dose being fixed, and preventing degradation of the mask due to the continuous irradiation of ions.

It is desirable that a mask formed before the ion implantation according to the present invention is used, which is obtained by patterning a silicon oxide film over the main surface of the semiconductor substrate and then further covering the surface and side surface thereof with a silicon nitride film because this prevents degradation of the mask by the irradiation ions at the side portion of the mask as well as damage of the surface of the semiconductor substrate due to a stress generated between the semiconductor substrate and the mask.

As stated above, in accordance with the present invention, a buried insulating layer surrounding a portion below the active region can be formed only by intermittent irradiation with ions which react with the semiconductor substrate to form the insulating layer and a heat treatment after that. Therefore, the productivity is increased compared with the conventional method in which an element isolation film of the side portion of an active region is formed by thermal oxidation, and degradation of the properties of crystal and the ions remaining in the active region are prevented. Furthermore, according to the method of the present invention, it is also possible to form a buried insulating layer having a fixed width regardless of the depth from the main surface of the semiconductor substrate if not only the ion implantation energy but the dose is suitably controlled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment according to the present invention will be specifically described in the following, with reference to FIGS. 3A to 3H. This embodiment is obtained by applying a combination of a conventional idea that the beam energy of the implanted ions is modified to change the center of the concentration profile of the ions in the direction of substrate depth (for example, Japanese Patent Laying-Open No. 64-37835) and a conventional method of manufacturing a semiconductor device disclosed in the publication above (Japanese Patent Laying-Open No. 61-185950), and further improving on it.

Figure 3A:
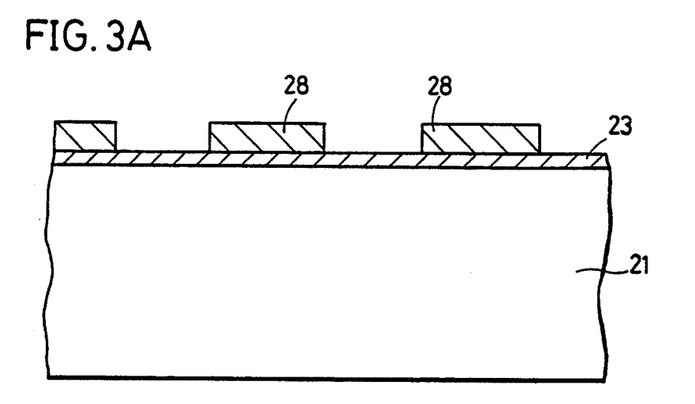
FIGS. 3A, 3B, 3C, 3D, 3E, 3F, 3G, and 3H are cross-sectional views sequentially showing in each step a process of manufacturing a semiconductor device in one embodiment according to the present invention.
Figure 3B:
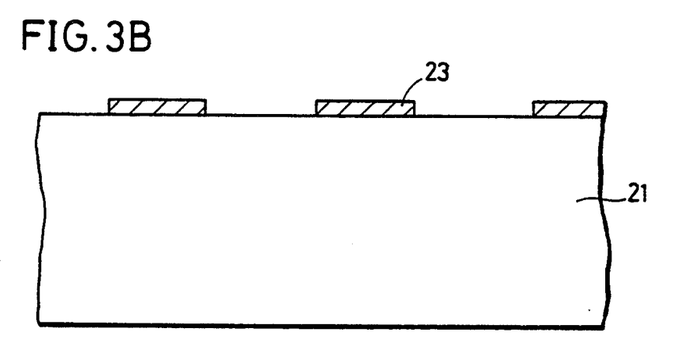
Figure 3C:
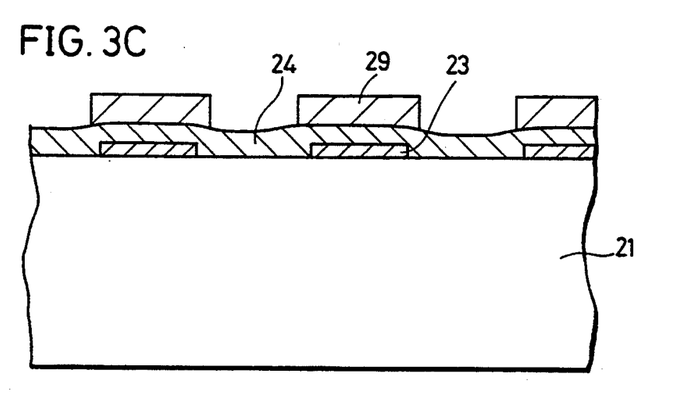
Figure 3D:
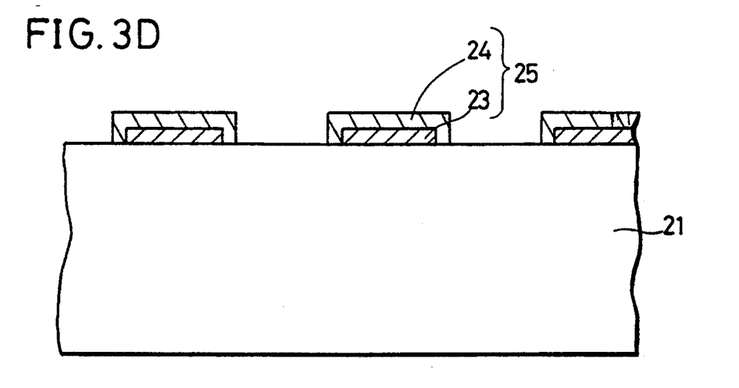
Figure 3E:
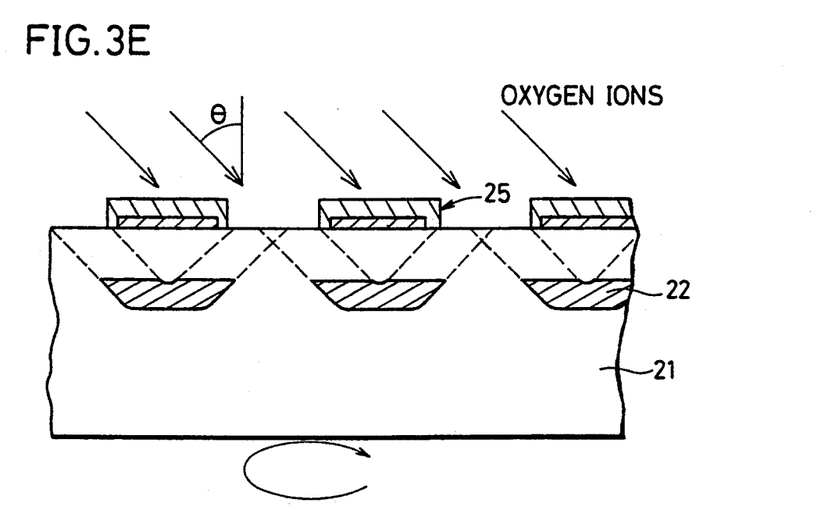

In a method of manufacturing a semiconductor device according to this embodiment, firstly, referring to FIG. 3A, a silicon oxide film 23 having a thickness of the order of 2000Å is formed on the entire main surface of a semiconductor substrate 21 formed of single crystal silicon by a thermal oxidation method or a CVD method. After that, a resist mask 28 of a predetermined pattern is formed by photolithography. Then, the exposed silicon oxide film 23 is removed by reactive ion etching to provide a pattern shown in FIG. 3B. Subsequently, referring to FIG. 3C, a silicon nitride film 24 having a thickness of about 5000Å deposited over the entire surface of the semiconductor substrate 21 by a CVD method or the like, and furthermore, a resist mask 29 of a predetermined pattern is formed on the surface of it by photolithography. After that, the exposed silicon nitride film 24 is removed by reactive ion etching to form a mask of a predetermined pattern 25 shown in FIG. 3D.

Figure 5A:
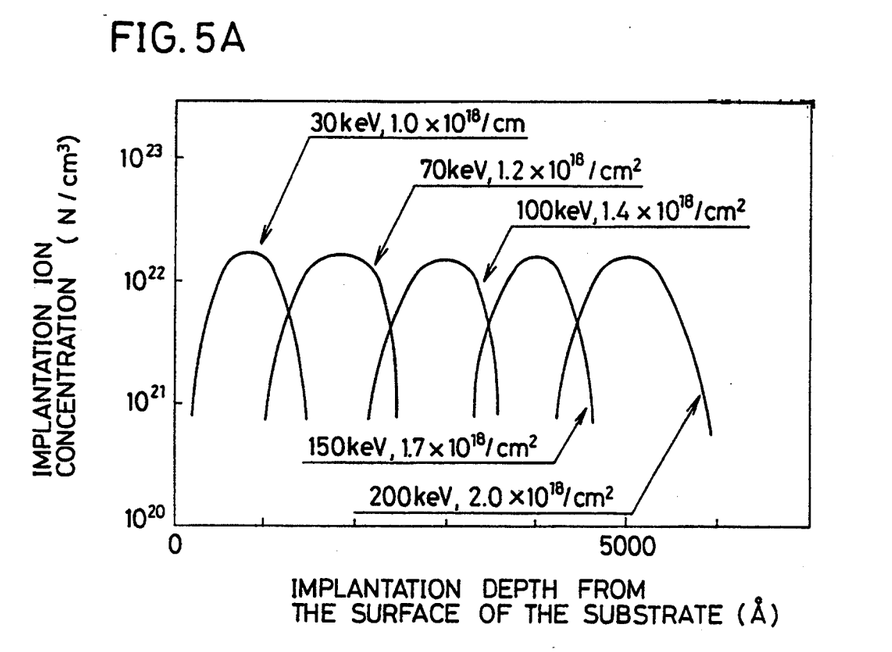
FIG. 5A is a graph indicating the relationship between the implantation depth from the substrate surface and the implanted ion concentration profile in each step with respect to the implantation energy and the dose of the oxygen ions applied in the embodiment of the present invention.
Figure 5B:
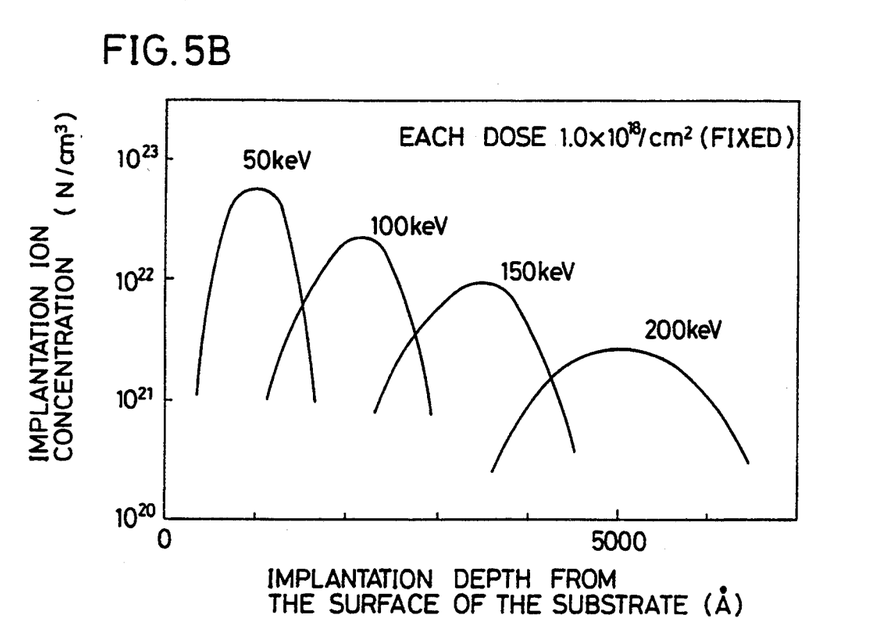
FIGS. 5B is a graph indicating the relationship between the implantation depth from the substrate surface and the implanted ion concentration profile when only the ion implantation energy is changed in steps with the dose being fixed.
Figure 6:
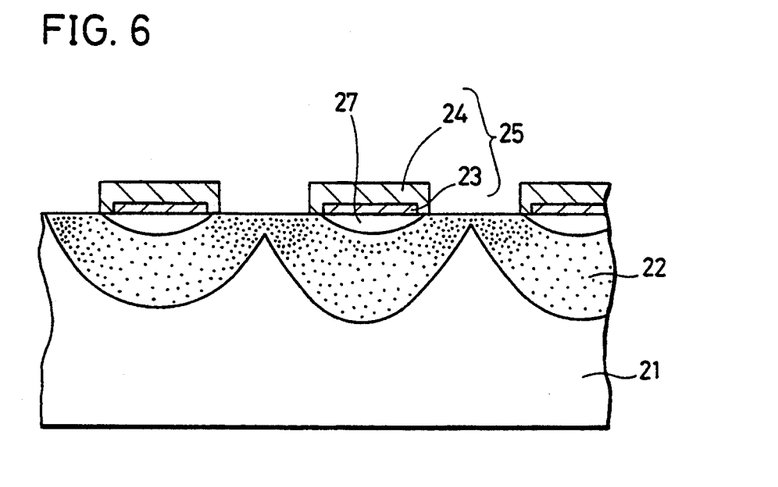
FIG. 6 is a cross-sectional view showing the state of the buried insulating layer 22 formed when ion implantation is carried out according to the embodiment of the present invention under the conditions indicated in the graph shown in FIG. 5

Then, irradiation of oxygen ions is intermittently carried out from the direction making a predetermined angle $\theta$ with respect to the main surface of the semiconductor substrate 21. Preferably, the angle $\theta$ is normally on the order of 45°. Simultaneously with the irradiation of the oxygen ions, the semiconductor substrate 21 is continuously rotated at a predetermined constant angular velocity around an arbitrary normal line of the main surface thereof. The irradiation of the oxygen ions is changed in five steps, for example, with the ion implantation energy 30 KeV to 200 KeV and the dose $1.0 \times 10^{18}/cm^2$ to $2.0 \times 10^{18}/cm^2$, respectively as shown in the graph of FIG. 5A. The reason for changing both of the ion implantation energy and the dose in this way is as follows. When the dose is fixed at $1.0 \times 10^{18}/cm^2$ in each step and the ion implantation energy is changed in four steps of 50 KeV to 200 KeV, as shown in the graph of FIG. 5B, as the implantation depth from the substrate surface becomes larger, the extent of the concentration profile from the center of the implanted ion concentration profile becomes larger. Therefore, when only the ion implantation energy is changed in steps with the dose being fixed, the concentration profile of the buried insulating layer 22 to be formed extends in the direction of depth in the vicinity of the center of the active region 27 and the concentration becomes low as shown in FIG. 6. Accordingly, not only the buried insulating layer 22 necessary for element isolation can not be formed in the portion below the center of the active region 27, but the sufficient size of the active region 27 itself where the oxygen ions are not mixed in can not be obtained.

Figure 3F:
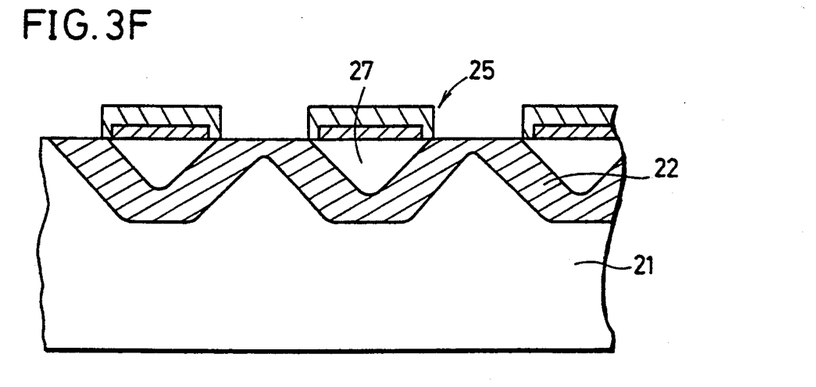
Figure 3G:
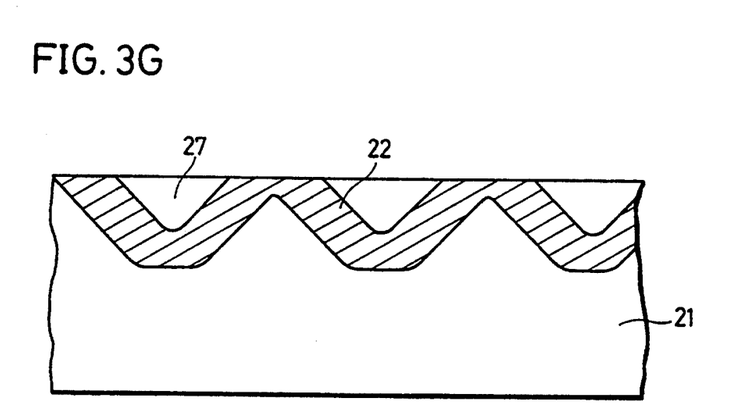

In this way, as shown in FIG. 3F, while securing the active region 27 having a sufficient depth below the mask 25, the buried insulating layer 22 can be formed surrounding and isolating/insulating the active region by the control in five steps of changing the ion implantation energy and the dose shown in the graph of FIG. 5A. Then, the mask 25 is removed by etching to form the structure shown in FIG. 3G. After that, referring to FIG. 3H, a gate insulating film 30 and a polysilicon layer 31 are formed in the vicinity of the center of the surface of the active region 27 and, furthermore, a predetermined patterning is carried out to form a gate electrode 32. Then, the semiconductor substrate 21 is irradiated with impurity ions such as phosphorus or arsenic using this gate electrode 32 as a mask and an impurity diffusion layer 33 to be a source/drain region is formed. In this way, an MOS type field-effect transistor is formed on the surface of the active region 27 isolated by the buried insulating layer 22.

Figure 3H:
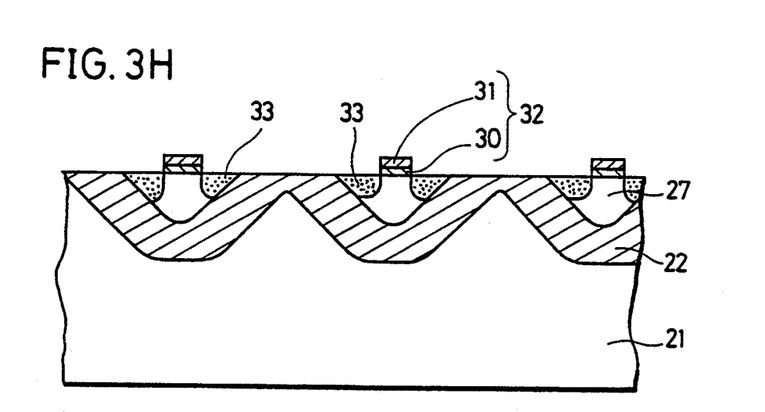

The MOS type field-effect transistor formed in this way is completely isolated by the buried insulating layer 22 from the main surface of the semiconductor substrate 1 to a predetermined depth, so that various problems caused by the parasitic capacitance due to the junction capacitance of the pn junction between the impurity diffusion layer 33 and the semiconductor substrate 21 are solved. A representative problem caused by the parasitic capacitance is a phenomenon of a so called latch-up in which a parasitic bipolar transistor formed in a CMOS (Complementary MOS) structure receives a noise signal or the like, so that it acts as a switch and an inverter is short-circuited.

In accordance with this embodiment, it is not necessary to form an isolation film on the side surface of the active region by thermal oxidation as in the conventional technique above, so that the number of processes is decreased and the productivity is increased.

Figure 4A:
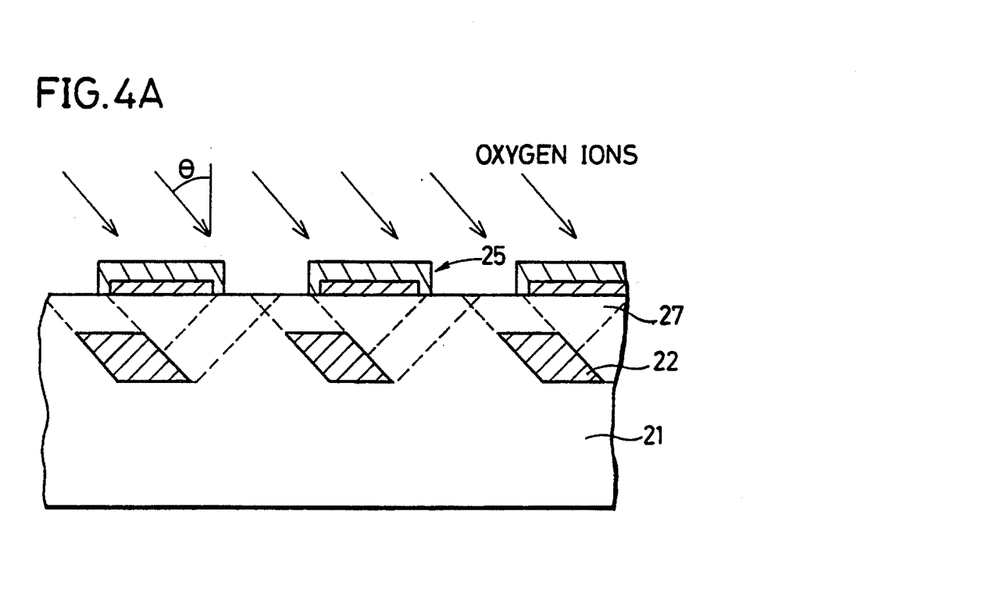
FIGS. 4A and 4B are cross-sectional views sequentially showing part of a process in another embodiment according to the present invention.
Figure 4B:
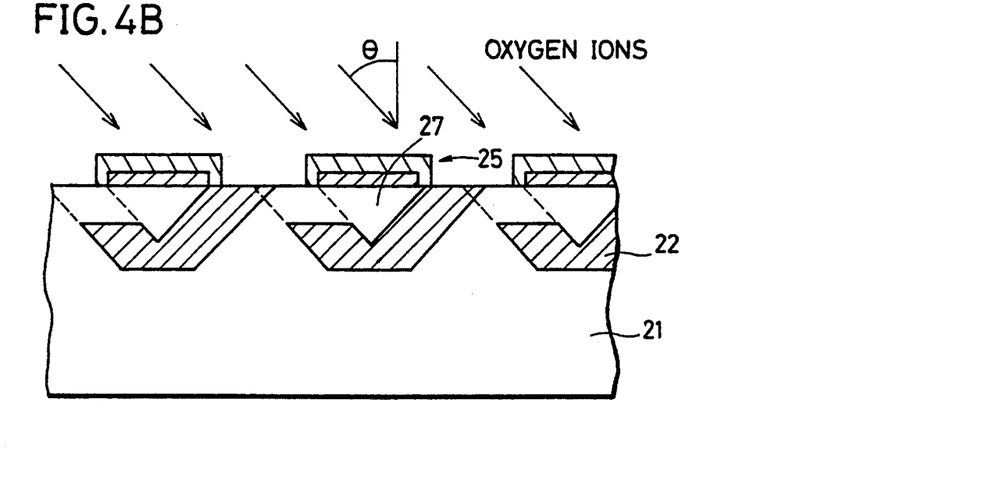

While the buried insulating layer 22 is formed by continuously rotating the semiconductor substrate 21 simultaneously with the irradiation of the oxygen ions in the embodiment above, it is also possible to form the buried insulating layer 22 by intermittently rotating the semiconductor substrate 21 in accordance with the configuration of the plane of the mask 25, i.e., the configuration of the plane of the active region 27 to be formed instead of rotating the semiconductor substrate 21 continuously. That is, if the mask 25 and the active region 27 have a long and thin configuration having a constant cross section shape, firstly, as shown in FIG. 4A, irradiation with oxygen ions is carried out from an oblique direction making an angle $\theta$ (normally on the order of 45°) with the main surface of the semiconductor substrate 21 and the ion implantation energy and the dose are changed in five steps shown in the graph of FIG. 5A with the semiconductor substrate 21 being stationary, so that half of the buried insulating layer 22 on the left side of the active region 27 is formed at first. Subsequently, the semiconductor substrate 21 is turned 180° relatively with respect to the direction of the oxygen ion implantation, using an arbitrary normal line of the main surface as an axis, and with the semiconductor substrate 21 being stationary in the condition, the ion implantation energy and the dose are further changed in five steps shown in the graph of FIG. 3A. As a result, the remaining half of the buried insulating layer 22 is formed. In this way, an element isolation layer surrounding the active region 27 along the bottom surface thereof is formed only with the buried insulating layer 22 by replacing the process shown in FIG. 3E of the embodiment above with the processes shown in FIGS. 4A and 4B, and almost the same effects are achieved as in the embodiment above.

In each embodiment above, it is desirable that the direction of the oxygen ion irradiation makes an angle $\theta$ of the order of 45° with respect to the normal line direction of the main surface of the semiconductor substrate 21. While the semiconductor substrate 21 includes single crystal silicon and the irradiation ions for forming the buried insulating layer 22 are oxygen ions in the embodiments above, the present invention is not limited to them and various kinds of combinations can be thought of as the kinds of the material of the semiconductor substrate 21 and the irradiation ions. However, the combination must be such that when the ions are implanted into the semiconductor substrate 21, they react with each other to form a layer of an insulator.

Not only the surface but also the side surface of the silicon oxide film 23 is covered with the silicon nitride film 24 in the cross-sectional structure of the mask 25 in order to prevent the silicon oxide film 23 on the side of the mask 25 from being eroded due to the continuous irradiation of the oxygen ions from the oblique direction thereby causing the width of the buried insulating layer 22 to become larger than a designed value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

preparing a semiconductor substrate formed of single crystal silicon;

forming a mask for block ion implantation on the main surface of the semiconductor substrate; and implanting oxygen ions from the direction making an angle of about 45° with respect to the main surface of said semiconductor substrate while intermittently changing values of the implantation energy and the dose to form an insulator layer including oxide silicon surrounding an active region in said semiconductor substrate, increasing the values of the ion implantation energy being accompanied with increasing the values of the dose, the values of the implantation energy and the dose being selected so as to fully enclose said active region with said insulator layer, wherein said step of the irradiation of the oxygen ions is carried out with said semiconductor substrate being rotated in a plane parallel to the main surface, and said step of forming the mask includes the steps of depositing a silicon oxide film on the main surface on said semiconductor substrate, selectively removing this silicon oxide film to form a patterned silicon oxide film, and then further covering the surface and side surface of the patterned silicon oxide film with a silicon nitride film.

2. The method of manufacturing the semiconductor device according to claim 1, after formation of said insulator layer, further comprising a step of forming a MOS field-effect transistor in the active region surrounded by said insulator layer.

3. The method of manufacturing the semiconductor device according to claim 2, wherein the step of forming said MOS field-effect transistor includes the steps of forming a gate insulating film on the surface of the active region surrounded by said insulator layer by a thermal oxidation method, forming a polysilicon layer on the gate insulating film, patterning the polysilicon layer to form a gate electrode, and implanting impurities having a conductivity type opposite to that of said semiconductor substrate using the gate electrode as a mask to form a source/drain region.

* * * * *